United States Patent [19]

Bourdelaise et al.

[11] Patent Number: 5,027,191
[45] Date of Patent: Jun. 25, 1991

[54] CAVITY-DOWN CHIP CARRIER WITH PAD GRID ARRAY

[75] Inventors: Robert A. Bourdelaise, Crofton; David B. Harris, Columbia; Denise B. Harris, Columbia; John A. Olenick, Columbia, all of Md.

[73] Assignee: Westinghouse Electric Corp., Pittsburgh, Pa.

[21] Appl. No.: 350,872

[22] Filed: May 11, 1989

[51] Int. Cl.⁵ .................... H01L 23/12; H01L 23/02
[52] U.S. Cl. ........................................ 357/74; 357/80; 361/386; 361/388
[58] Field of Search .................... 357/74, 80; 361/386, 361/388

[56] References Cited

U.S. PATENT DOCUMENTS

| | | | |
|---|---|---|---|
| 4,506,938 | 3/1985 | Madden | 339/17 CF |
| 4,513,353 | 4/1985 | Bakermans et al. | 361/399 |
| 4,513,355 | 4/1985 | Schroeder et al. | 357/74 |
| 4,551,746 | 11/1985 | Gilbert et al. | 357/74 |
| 4,561,006 | 12/1985 | Currie | 357/74 |
| 4,608,592 | 8/1986 | Miyamoto | 357/74 |
| 4,648,666 | 3/1987 | Lovell | 339/17 CF |
| 4,655,524 | 4/1987 | Etzel | 339/59 M |
| 4,676,564 | 6/1987 | Mitchell, Jr. | 439/77 |
| 4,692,790 | 9/1987 | Oyamada | 357/79 |
| 4,695,870 | 9/1987 | Patraw | 357/74 |
| 4,699,593 | 10/1987 | Grabbe et al. | 439/71 |
| 4,703,984 | 11/1987 | Mitchell, Jr. | 439/70 |
| 4,705,917 | 11/1987 | Gates, Jr. et al. | 357/74 |
| 4,733,172 | 3/1988 | Smolley | 324/158 P |
| 4,750,089 | 6/1988 | Derryberry et al. | 361/388 |
| 4,760,335 | 7/1988 | Lindberg | 324/158 |
| 4,807,019 | 2/1989 | Tustaniwskyj | 357/74 |
| 4,860,165 | 8/1989 | Cassinelli | 361/414 |
| 4,910,584 | 3/1990 | Mizuo | 357/74 |
| 4,933,808 | 6/1990 | Horton et al. | 361/388 |

FOREIGN PATENT DOCUMENTS

| | | |
|---|---|---|
| 0261013 | 3/1988 | European Pat. Off. |
| 57-85244 | 5/1982 | Japan |
| 0197863 | 11/1983 | Japan .................. 357/74 |
| 62-112354 | 5/1987 | Japan |
| 63-250845 | 10/1988 | Japan .................. 357/74 |
| 63-301552 | 12/1988 | Japan .................. 357/74 |
| 1-25444 | 1/1989 | Japan ................. 437/215 |
| 1-151252 | 6/1989 | Japan .................. 357/74 |

OTHER PUBLICATIONS

European Patent Application, Publication Number 0150928-A2 Published 8/7/85 entitled, "A Compliant Interconnection Device and Assembly Method of Manufacture, and of Micro Interconnection Casting."

Great Britain Patent Application No. GB 2,135,525A Published 8/30/84 entitled "Heat Dissipating Chip Carrier Substrates."

Primary Examiner—Andrew J. James
Assistant Examiner—Viet Q. Nguyen
Attorney, Agent, or Firm—J. L. Brzuszek

[57] ABSTRACT

The invention is an improved chip carrier assembly utilizing a cavity-down chip carrier with a pad grid array wherein the IC chip within the chip carrier is mounted against a surface opposite the PWB to which the chip carrier is attached such that heat transfer from the IC chip may occur along a short path to a heat sink such that a large heat transfer rate is possible. Furthermore, the apparatus utilizes an alignment and electrical connection means between the contact pads of the chip carrier and a PWB to which the chip carrier is attached to compensate for shrinkage variation which occurs during the chip carrier fabrication process. Furthermore, within the cavity of the chip carrier there is space for additional components such as a decoupling capacitors. This permits the design of an apparatus providing better heat transfer properties, more accurate contact pad locations and the option of including within the chip carrier components which in the past had been mounted outside of the chip carrier.

6 Claims, 3 Drawing Sheets

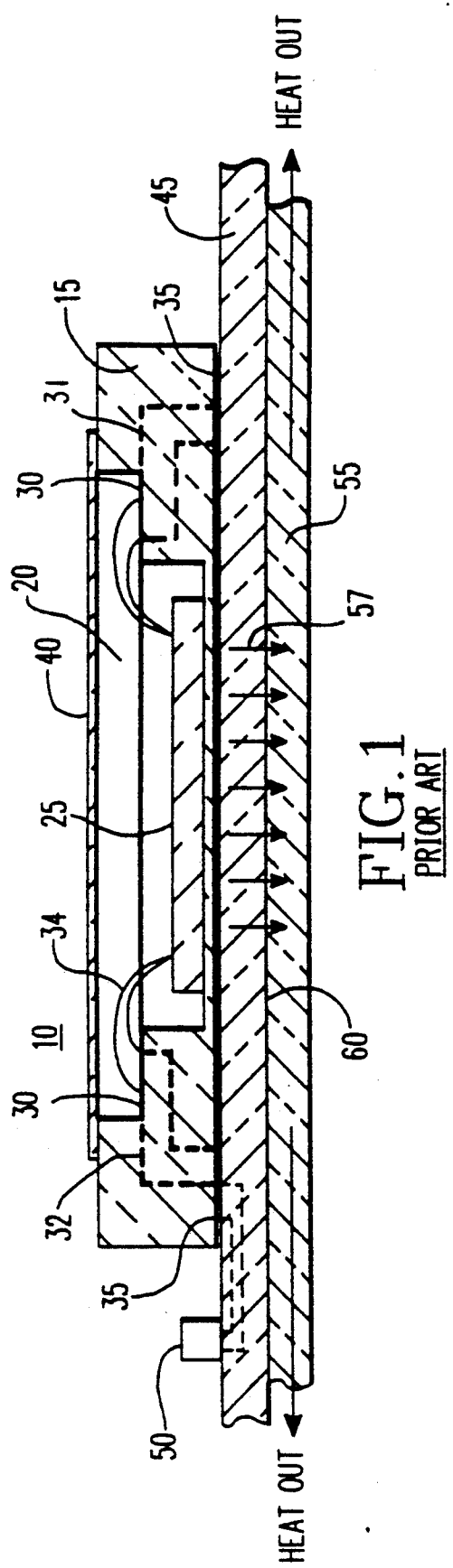
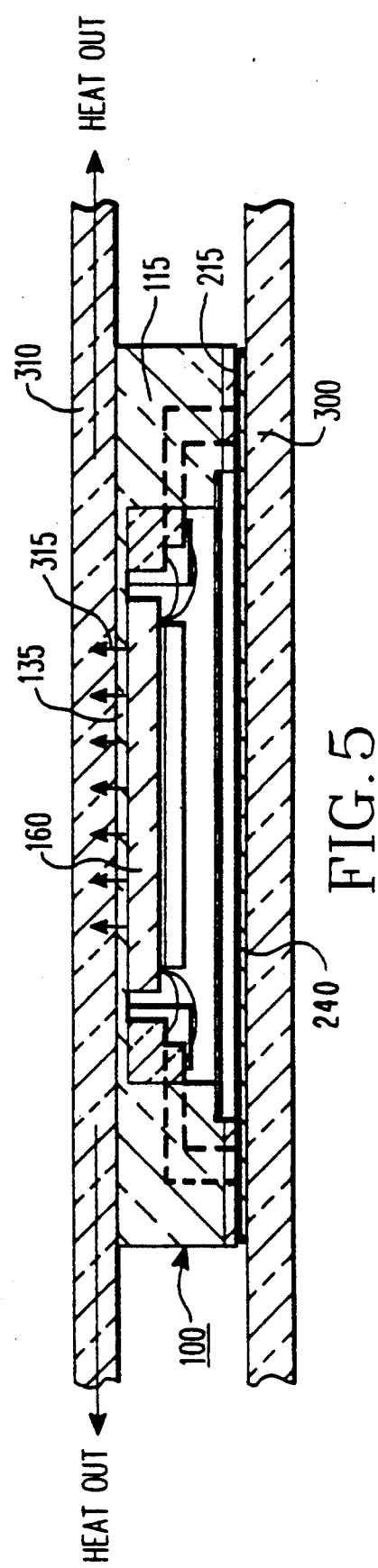

CAVITY-DOWN CHIP CARRIER WITH PAD GRID ARRAY

CROSS-REFERENCE TO RELATED APPLICATIONS

This application is related to the copending U.S. patent application entitled, "A Solderless Printed Wiring Board Module And Multi-module Assembly", Ser. No. 07/350,862 filed May 11, 1989.

BACKGROUND OF THE INVENTION

This invention relates to connections in electronic assemblies and more particularly to a surface mounted integrated circuit chip carrier.

Surface mounted devices (SMDs) are electronic components that are designed to sit on the surface of a printed wiring board (PWB) or another compatible substrate. Components such as resistors, capacitors, diodes, transistors and integrated circuits (IC) may be designed as SMDs and, as such, have either no leads but flat interfacing surfaces or very short leads. The interfacing surfaces or the short leads of these components serve as contact pads which align with corresponding electrical connections on a PWB.

Typically the components are mounted or fabricated within a ceramic or plastic carrier to provide a desired configuration having contact pads on the external surface of the carrier which are electrically connected to the component contained therein.

The advantages of SMDs are numerous. The size of these devices may be 30 to 60% smaller than the traditional leaded components they replace. The holes within the PWBs which accept the leads of leaded components are no longer necessary when utilizing SMDs. For this reason, not only may SMDs be mounted closer together, but SMDs may also be mounted on each side of a PWB. Because of these factors, the overall size and weight of a populated PWB is less than that of a PWB using leaded components.

One specific type of an SMD is an IC chip carrier. Because of the frailty and the inherently small size of an IC chip, the IC chip is typically mounted in a chip carrier which provides structural reinforcement for the chip and also provides a means for making external electrical connections to the IC chip. A chip in a sealed ceramic carrier has the further advantage of providing to the chip hermetic isolation from the outside environment.

Utilizing current chip carrier designs, problems arise when the IC chip is a high power device which generates substantial amounts of heat. First of all SMD technology the size of the chip carrier may be reduced but the necessary heat transfer from the IC chip remains the same. For this reason a chip carrier design is required that is more conducive to transferring heat from the IC chip, thereby permitting heat transfer from an IC chip within a smaller chip carrier.

Secondly, in the past decoupling capacitors used in conjunction with the IC chip were mounted elsewhere on the PWB and electrically connected to the IC chip or a capacitor was mounted to the exterior of the chip carrier, thereby requiring external connections from the chip carrier to the decoupling capacitor even though the decoupling capacitor was electrically connected only to the IC chip.

Thirdly, ceramic materials are used in the fabrication of the chip carrier and associated with the use of ceramic is some degree of shrinkage during the chip carrier fabrication. This becomes critical with SMD chip carriers because the contact pads on the outside of the carrier must be in a precise pattern to align with mating pads on the PWB. As the size of the distance between contact pads is reduced, precise patterns become even more critical.

FIG. 1 shows a cavity-up chip carrier with a pad grid array 10. The chip carrier 10 is comprised of a body 15 having an upwardly facing cavity 20. An IC chip 25 is mounted at the base of the cavity 20. The body 15 configuration is such that within the cavity 20 are a series of ledges 30. From the surface of a ledge 30, electrical strips known as traces 31 extend through the body 15 to vias 32 which then extend downward and are distributed within the body 15 such that each via 32 emerges through the bottom of the body 15 to connect with electrical contact pads 35 of the chip carrier 10. Bonding wires 34 extend from connections on the IC chip 25 to corresponding traces 31 on the ledge 30 of the body 15. With this arrangement, each chip connection from the IC chip 25 is electrically connected to a pad 35 at the bottom of the body 15. As a protective measure, a package lid 40 is secured to the body 15 to fully enclose the cavity 20. The arrangement of the pads 35 at the bottom of the body 15 may form a grid array which extends over the entire area of the bottom of the body 15 or may form a pad arrangement limited to a single row of pads around the perimeter of the body 15. With the number of connections from an IC chip remaining approximately constant and the size of chip carriers steadily reducing, the arrangement of pads in a single row around the perimeter of the body 15 may become impossible because of the necessity for a minimum pad 35 size and therefore it becomes necessary to utilize pads in a grid array arrangement to take full advantage of the area at the bottom of the body 15.

The chip carrier 10 is secured to a PWB 45 which has on its surface electrical interconnect pads (not shown) to which the pads 35 on the chip carrier 10 are aligned. The pads 35 may be secured to the PWB 45 using solder at each carrier pad/PWB interconnect pad interface or may be secured utilizing an external mechanical means to secure the chip carrier 10 to the PWB 45. A decoupling capacitor 50 typically associated with IC chips is attached to the PWB 45 at a proximate location to the chip carrier 10 and electrical connections are made between the decoupling capacitor 50 and the chip carrier 10. In some instances the decoupling capacitor 15 is externally mounted upon the chip carrier 10. Note that an electronic component other than a decoupling capacitor may also be mounted relative to the chip carrier in the same manner as that just described.

The body 15 may be made ceramic and as such during fabrication experiences shrinkage. Because of the tolerance required to fabricate a chip carrier 10 with precisely located pads 35, great care must be taken in designing and fabricating the body 15 such that after shrinkage, the location of the pads will be known. While the shrinkage of the ceramic material used to construct the body is uniform and there is a predictable error range of shrinkage, accurate determination of the locations of the pads 35, after the base has been fabricated, is very difficult.

Furthermore, oftentimes the IC chip 25 will generate substantial amounts of heat that must be effectively removed in order to avoid damage to the chip 25. Typically, the PWB 45 has associated with it a heat sink 55 secured to the PWB 45 through an adhesive interface 60. Heat generated by the IC chip 25 is first conducted through the body 15 and then conducted through each of the pads 35 to the associated PWB interconnect pads at the PWB 45. From here, the heat passes through the PWB 45 past an adhesive interface 60 to a heat sink 55, as indicated by arrows 57, where the heat is removed. For high power IC chips, this heat transfer path may not be adequate to remove all of the generated heat.

It is an object of this invention to provide a chip carrier design that effectively removes heat from a high powered IC chip.

It is another object of this invention to provide a chip carrier design in which the decoupling capacitors may be located directly within the chip carrier body.

It is still another object of this invention to provide a chip carrier design in which the locations of the external electrical contact pads on the chip carrier are known with precision.

SUMMARY OF THE INVENTION

The invention is an improved chip carrier design comprised of an integrated circuit chip carrier package comprised of a body of an electrically insulating material having planar top and bottom surfaces with a thickness therebetween and a central cavity extending through the top surface to a distance above the bottom surface thereby defining a cavity floor upon which an integrated circuit chip having a plurality of chip connections extending therefrom is mounted, and a cavity wall and at least one bonding ledge having an outer surface and extending from the cavity floor along the cavity wall, a plurality of vias of electrically conductive material and with cross-sectional areas within the body, each with a first and a second end, the first ends of the vias terminating at and penetrating through the body top surface at approximate locations in a predetermined pattern and the second ends of the vias terminating at and penetrating through the bonding ledge outer surface, electrical connection means extending from each of the chip connections to the second end of a corresponding via such that an electrically conductive path is established between the chip connections and corresponding vias terminating at the body top surface and a cover plate, with an area approximately equal to the cavity area, secured at the body top surface such that the cavity is fully enclosed.

BRIEF DESCRIPTION OF THE DRAWINGS

FIG. 1 is prior art and shows a cross-section of an existing cavity-up chip carrier with pad grid array;

FIG. 5 shows the cavity-down chip carrier situated between a PWB and a heat sink for optimal heat transfer.

DESCRIPTION OF THE PREFERRED EMBODIMENT

Figure 2:
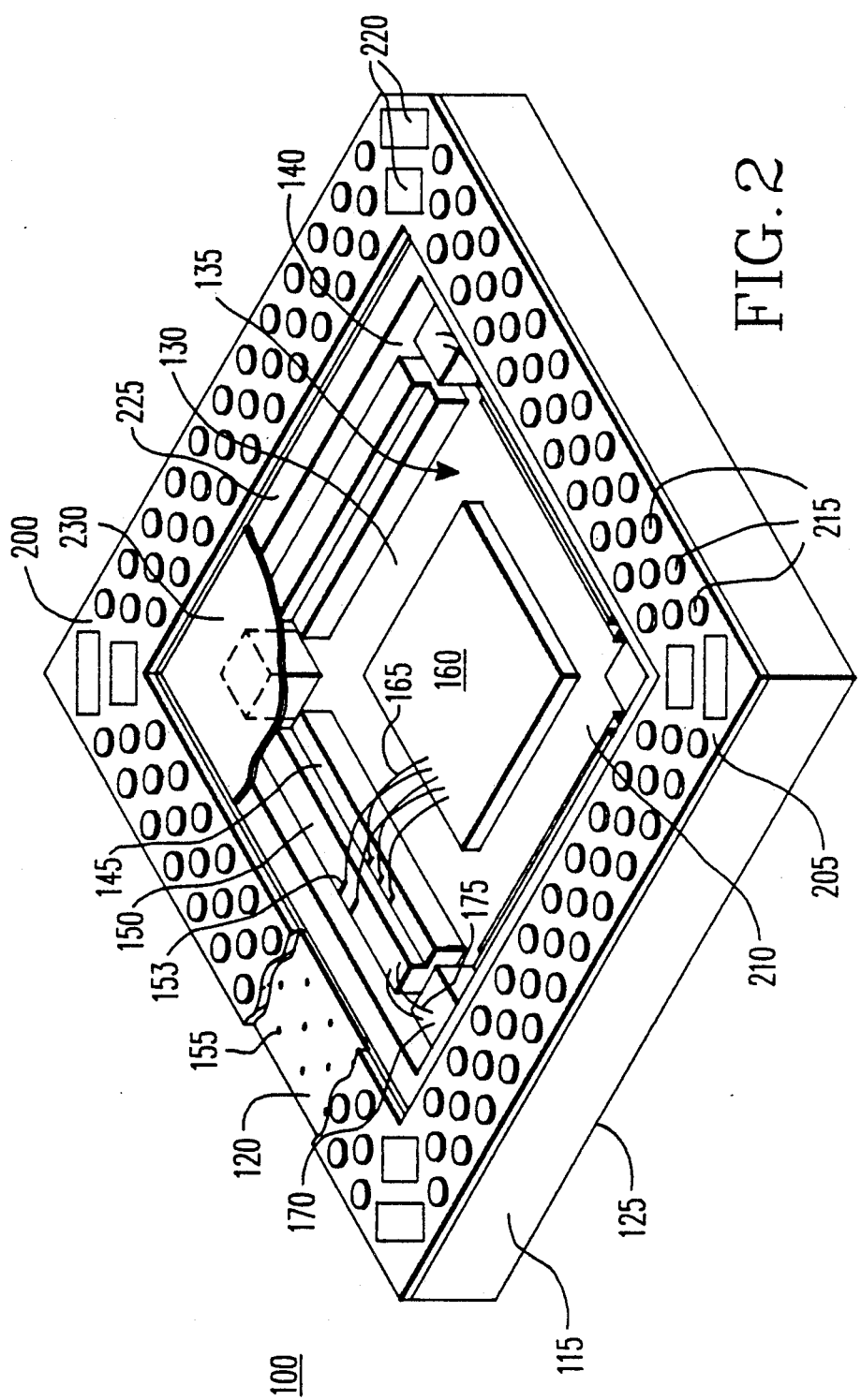
FIG. 2 shows an isometric view of the cavity-down chip carrier with pad grid array.

The preferred embodiment of the invention is illustrated in FIGS. 2 through 5. Just as in FIG. 1, FIG. 2 shows a chip carrier 100 having a body 115 with a planar top surface 120 and a planar bottom surface 125. Within the body 115 is a cavity 130 which defines a cavity floor 135 and cavity walls 140. A first bonding ledge 145 and a second bonding ledge 150 within the cavity 130 extend from the cavity floor 135 along the cavity walls 140. A plurality of electrical strips, or traces 153, extend from the surface of each bonding ledge 145 and 150 through the body 115 and intersect with vias 155 which extend upward and penetrate through the body top surface 120. An IC chip 160 is mounted on the cavity floor 135. From the IC chip 160 are a plurality of bonding wires 165 which electrically connect the IC chip 160 to corresponding traces 153 on the bonding ledges 145 and 150.

In order to minimize the length of the wires 165 from the IC chip 160 to the bonding ledge traces 153, the height of the first bonding ledge 145 from the cavity floor 135 is very close to that of the height of the IC chip 160 from the cavity floor 135. Furthermore, the distance between each bonding wire 165 coming from the IC chip 160 is defined as the pitch and for an IC chip, this distance may be of the order of magnitude of 0.004 inches. The bonding wires 165 are typically bonded to the traces 153 on the bonding ledges 145 and 150. Because the pitch between the bonding wires attached to a typical IC chip 160 is so small, using currently available wire bonding technology attaching the wires 165 to a single ledge such as 145 would be beyond the current fabrication technology. As a solution, the bonding wires 165 remain approximately parallel as they leave the chip 160 and are separated by a distance of the pitch but the wires are then attached to traces 153 which are staggered along a plurality of ledges. In this manner, assuming two ledges are used, then the distance between two consecutive bonding wires 165 on a single ledge is equal to a distance of twice the pitch at the IC chip connections which then permits bonding of the wires 165 to the traces 153 on the bonding ledge 145 and 150 surfaces. If an IC chip was utilized in which the pitch of the wires 165 coming from the IC chip 160 was greater, then it could be possible to utilize only a single bonding ledge 145.

Note the bonding ledges 145 and 150 do not extend the length of the entire cavity wall 140. This permits other components such as a decoupling capacitor 170 to be mounted within the cavity 130 along with the IC chip 160. Electrical connections, through bonding wires 175 may be made between the decoupling capacitor 170 and the traces 153 on the bonding ledges 145 and 150. Furthermore, when necessary, a portion or all of the cavity floor may be metallized and electrically connected to the capacitors 170, such that at one terminal on the capacitors 170 the bonding wires 175 would be attached and at the other terminal on the capacitor 170, which would rest on the cavity floor, a second attachment could be made. The metallized segment (not shown) would then be electrically attached using traces to vias within the body 115.

The width of a typical trace 153 is about 0.004 inches. While this is an acceptable size with which to attach a bonding wire 165, this width does not produce an area that would be practical for use in external connections to the chip carrier. Furthermore, as mentioned earlier, during the fabrication of the body 115, the ceramic material which the body is comprised of, tends to shrink. For this reason, the shrinkage of the body 115 at the location of the vias 155 on the planar top surface 120 is uniform. While the shrinkage of the ceramic material used to construct the body is uniform, and there is a predictable error range of shrinkage, accurate determination of the locations of the pads, after the base has been fabricated, is very difficult. It is critical to provide a chip carrier with the external contact points at known locations on the chip carrier.

The traces 153 and the vias 155 will be referred to for simplicity as electrical connectors. While the original design of the body 115 and the location of the vias 155 within the body may be calculated and placed such that the body 115 will shrink to locate the vias 155 in proper locations, this is a fairly complex procedure and a simpler solution is utilized in this invention. An alignment and electrical connecting means 200 is made up of a thin planar electrically insulating rectangular layer 205 with a central opening 210. The layer 205 has a plurality of contact pads 215 located such that when the alignment and connecting means 200 is overlaid upon the planar top surface 120 of the body 115, the contact pads 215 are approximately aligned with the vias 155 extending through the surface of the planar top surface 120 of the body 115. The radius of each contact pad 215 is uniform and intentionally larger than the radius of the vias 155.

The radius of each of the contact pads 215 will depend on a number of factors including the ceramic material used for the body, the radius of the vias and finally the desired overlap of the contact pads 215 with the corresponding vias 155.

Since the shrinkage is greatest at the edge of the body 115, the amount of shrinkage is calculated at the edge of the body 115 and this value is added to the radius of the via 155 along with a value representing the desired overlap between a pad 215 and a via 155. This sum is then used as the value for the minimum pad 215 radius, thereby providing a pad size that will ensure contact with the respective via and also provide at least the desired overlap. While a layer 205 which is located on the body 115 surface has been discussed for locating the pads 215 over the respective vias 155, it is entirely possible to place pads 215 directly onto the vias 155 without the need for layer 205, however the pad 215 size would remain the same. Note the ground pads 220 on the body 115. Just as the pads 215 are connected to vias 155, so to are the ground pads 220. Because of their larger size, one ground pad 220 may cover more than one via 155, or the via may be designed to conform with the shape of the ground pad 220. There may be an edge 225 around the inner perimeter of the body 115 such that a lid 230 may enclose the cavity 130 and seal the chip 160 within the cavity 130.

Figure 3:
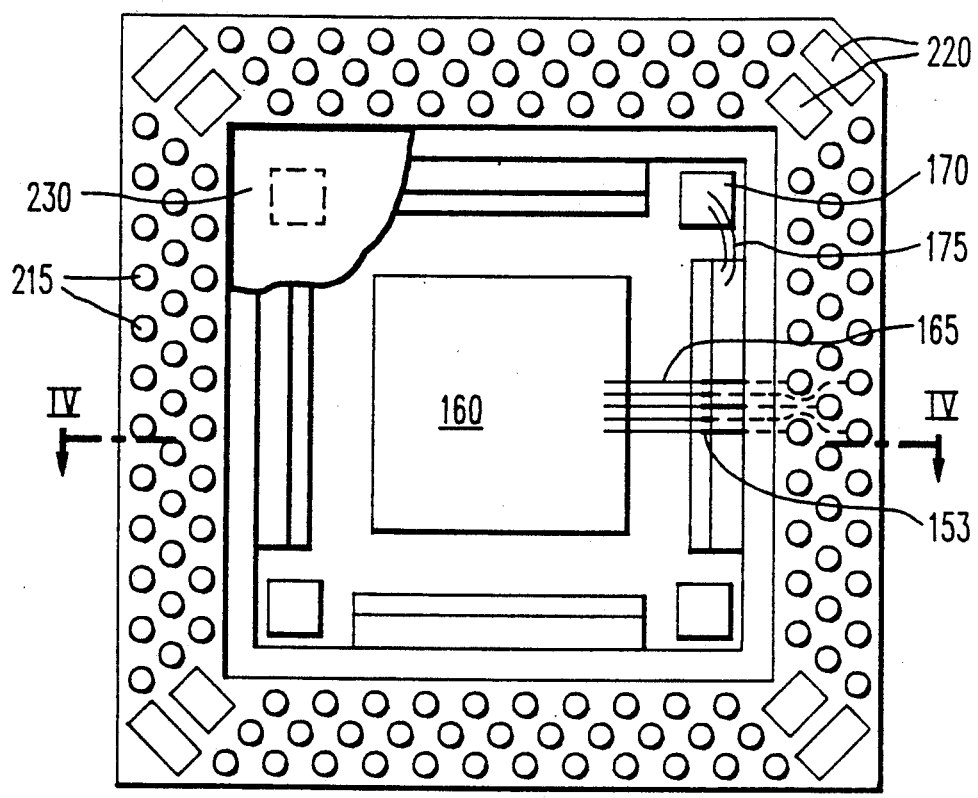
FIG. 3 shows a plan view of the cavity-down chip carrier with pad grid array shown in FIG. 2.
Figure 4:
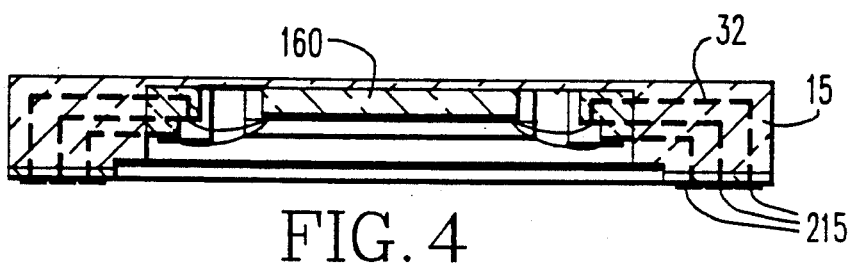
FIG. 4 shows a cross sectional view of the cavity-down chip carrier with pad grid array shown in FIG. 2.

FIGS. 3 and 4 show a plan view and a section view respectively of the chip carrier shown in FIG. 2. Similar items of FIG. 2 have the same item number in FIGS. 3 and 4.

FIG. 5 shows an application for the chip carrier 100. The contact pads 215 of the chip carrier are aligned with mating pads not shown on the PWB 300.

The chip carrier 100 may be secured to the PWB 300 in a number of ways. The contact pads 215 may be directly soldered to the interconnect pads on the PWB 300. However, it is then difficult to inspect the solder joints between the chip carrier 100 and the PWB 300 to verify the integrity of the connection. Furthermore, in the event removal of the chip carrier 100 from the PWB 300 becomes necessary, it may be difficult to remove the chip carrier 100 from the PWB 300 since the inner most contact pads 215 on the chip carrier are inaccessible.

Figure 6:
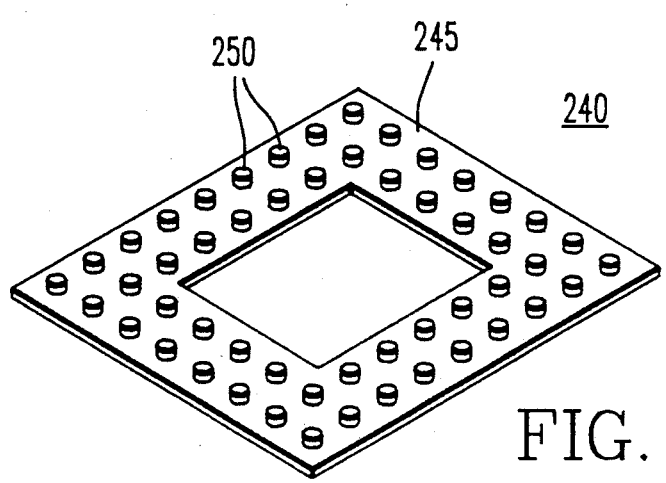
FIG. 6 is an isometric view showing a detail of the compliant solderless interface used as an electrical interconnect between the PWB and a chip carrier.

A second preferred method for securing the chip carrier 100 against the PWB 300 involves the utilization of a compliant solderless interface 240. The compliant solderless interface 240 illustrated in FIG. 6. An insulating planar frame 245 contains individual wads of finely woven electrically conductive wire inserted into holes in the frame 245 which form contact pads 250. The pads 250 are arranged to align with the PWB interconnect pads and the component contact pads. The component compliant interface 240 is manufactured under the tradename "CIN::APSE" by the Cinch company. Other types of compliant solderless interfaces are commercially available and may be utilized as long as electrical contact between the carrier interconnect pads and the component contact pads is provided.

The interface material is placed between the contact pads 215 and the contact pads on the PWB 300. The chip carrier 100 is then secured to the PWB 300 such that the compliant solderless interface 240 is slightly compressed between the contact pads 215 and the PWB 300 contact pads. One arrangement for securing chip carrier 100 to the PWB 300 could involve the use of an epoxy around the perimeter of the chip carrier 100 such that the chip carrier 100 is secured to the PWB 300. Another arrangement for securing the chip carrier 100 to the PWB 300 involves a flat plate 310 which in conjunction with the PWB 300 is used to compress the chip carrier 100 against the compliant solderless interface 240 which is then compressed against the PWB 300. The flat plate 310 is then independently secured to the PWB 300. This may be accomplished through mechanical means such as a bolt or by means of a spacer between the flat plate 310 and the PWB 300 to which both are secured through epoxy.

A feature of this invention involves the use of a thermally conductive material for the flat plate 310 such that the plate 310 may also substitute as a heat sink. This exploits an important aspect of the invention because it permits heat transfer from the IC chip 160 over an entirely different path than that previously described for cavity up chip carriers. The heat transfer path must no longer pas through the thickness of the body 115 and through the contact pads 215 to the PWB 300. There is now a much shorter more efficient path to induce heat transfer. With the IC chip 160 mounted to the cavity floor 135, the heat transfer path, indicated by arrows 315, now extends through the cavity floor directly to the flat plate 310 which is utilized as a heat sink. Thermal management is greatly affected by removing heat through the cavity floor since a heat sink applied directly to the chip carrier 100 provides a much shorter thermal path than does the conventional thermal management approach shown in FIG. 1.

The estimated thermal impedance for the path shown in FIG. 5 is approximately 0.46° C. per watt. This assumes the body 115 to be made of a ceramic of aluminum oxide with a cavity floor thickness of 0.015 inches. The cavity up chip carrier shown in FIG. 1 has an estimated thermal impedance of 3.64° C. per watt. As can be seen, the improved heat transfer between the chip carrier shown in FIG. 1 and that shown in FIG. 5 is substantial.

Finally note that the base 115 and the ledges 145 and 150 should be of the same material, which could be ceramic and be comprised of one of the materials of aluminum oxide, beryllia or aluminum nitride.

Although this invention has been described with reference to a specific embodiment thereof, numerous modifications are possible without departing from the invention, and it is desirable to cover all modifications falling within the spirit and scope of this invention.

We claim:

1. An integrated circuit chip carrier package comprised of:
   a) a body of an electrically insulating material having
      i) planar top and bottom surfaces and having a cavity with cavity walls and a cavity floor located proximate to either one of said body planar surfaces upon which an integrated circuit chip having a plurality of chip connections extending therefrom is mounted and
      ii) at least one bonding ledge having an outer surface and extending from the cavity floor along the cavity wall,
   b) a plurality of vias of electrically conductive material within the body, each with a first and a second end, the first ends of the vias terminating at the body top surface in a predetermined pattern and the second ends of the vias correspondingly terminating with continuity at the bonding ledge outer surface,
   c) electrical connection means extending from each of the chip connections to the second end of a corresponding via such that an electrically conductive path is established between the chip connections and corresponding vias,
   d) a cover plate secured to the body planar surface located relatively non-proximate to said cavity floor to fully cover the cavity and
   e) a planar electrically insulating layer secured to the body top surface, the layer having an opening therethrough aligned with the body cavity opening and having a plurality of contact pads extending through the layer with each pad associated with and contacted by an associated via first end from the body and each pad having a greater cross-sectional area than that of the associated via and each pad further positioned at a precise predetermined location through the layer such that dimensional variations in the via first end locations caused by fabrication of the body may be compensated by the predetermined locations of the contact pads thereby providing alignment and electrical connection between the via first end and a mating external electrical connection.

2. The apparatus according to claim 1 further comprised of at least one capacitor mounted within the cavity.

3. The apparatus as recited in claim 1 further comprising a planar compliant solderless interface lying adjacent to and contacting the contact pads of the secured electrically insulating layer such that the interface, when compressed between the electrically insulating layer and a contact surface of a mating component, deflects and provides electrical circuit paths between the contact pads of the electrically insulating layer and the contact surface of the mating component.

4. The apparatus according to claim 3 wherein the electrical connection means is a plurality of wires with each wire bonded to form an electrical connection from a chip connection to a corresponding via at the bonding ledge surface.

5. The apparatus according to claim 4 wherein the insulating material of the body is a ceramic selected from the group consisting of aluminum oxide, beryllia and aluminum nitride.

6. An integrated circuit chip carrier package comprised of:
   a) a body of an electrically insulating material having
      i) planar top and bottom surfaces and having a cavity with cavity walls and a cavity floor associated with one of said body planar surfaces upon which an integrated circuit chip having a plurality of chip connections extending therefrom is mounted and
      ii) at least one bonding ledge having an outer surface and extending from the cavity floor along the cavity wall,
   b) a plurality of vias of electrically conductive material within the body, each with a first and a second end, the first ends of the vias terminating at the body top surface in a predetermined pattern and the second ends of the vias correspondingly terminating at the bonding ledge outer surface,
   c) a plurality of electrically conductive wires, each wire extending from a chip connection to the second end of a corresponding via such that an electrically conductive path is established between the chip connections and corresponding vias,
   d) a cover plate associated with the other of said body planar surfaces being opposite to said cavity floor, said cover plate being secured to the body to fully cover the cavity and
   e) a planar electrically insulating layer secured to the body top surface, the layer having an opening therethrough aligned with the body cavity opening and having a plurality of contact pads extending through the layer with each pad associated with and contacted by an associated via first end from the body and each pad having a greater cross-sectional area than that of the associated via and each pad further positioned at a precise predetermined location through the layer such that dimensional variations in the via first end locations caused by fabrication of the body may be compensated by the surrounding locations of the contact pads thereby providing alignment and electrical connection between the via first end and a mating external electrical connection.

* * * * *